United States Patent
Xu et al.

(10) Patent No.: US 10,585,320 B2
(45) Date of Patent: Mar. 10, 2020

(54) ARRAY SUBSTRATE AND DRIVING METHOD AND MANUFACTURING METHOD THEREOF

(71) Applicants: BOE Technology Group Co., Ltd., Beijing (CN); Chongqing BOE Optoelectronics Technology Co., Ltd., Chongqing (CN)

(72) Inventors: Zhuo Xu, Beijing (CN); Yajie Bai, Beijing (CN); HeeCheol Kim, Beijing (CN); Hailong Wu, Beijing (CN); Yi Dan, Beijing (CN); Jianbo Fu, Beijing (CN); Yuqing Zhang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/112,060

(22) Filed: Aug. 24, 2018

(65) Prior Publication Data
US 2019/0250451 A1    Aug. 15, 2019

(30) Foreign Application Priority Data
Feb. 9, 2018   (CN) ........................ 2018 1 0134567

(51) Int. Cl.
G02F 1/1362       (2006.01)
G02F 1/1368       (2006.01)
(Continued)

(52) U.S. Cl.
CPC ........ *G02F 1/13624* (2013.01); *G02F 1/1368* (2013.01); *G02F 1/134363* (2013.01);
(Continued)

(58) Field of Classification Search
CPC ......... G09G 3/3648; G09G 2300/0413; G09G 2300/0809; G09G 2310/021;
(Continued)

(56) References Cited

U.S. PATENT DOCUMENTS 8,395,157 B2   3/2013   Park et al.
8,853,016 B2   10/2014  Park et al.
(Continued)

FOREIGN PATENT DOCUMENTS

CN    103760703 A    4/2014
CN    105514120 A    4/2016
(Continued)

*Primary Examiner* — Brent D Castiaux
(74) *Attorney, Agent, or Firm* — Westman, Champlin & Koehler, P.A.

(57) ABSTRACT

The embodiment of the present disclosure discloses an array substrate. The array substrate comprises: a base, a plurality of first scanning lines, a plurality of second scanning lines, a plurality of data lines, a common electrode line, and a plurality of pixel units. Each of the pixel units comprises: a first electrode, a second electrode, a switch transistor, a shared transistor and a shared capacitor. The switch transistor has a first terminal coupled to the second electrode, a second terminal coupled to one of the plurality of data lines, a bottom gate coupled to one of the plurality of first scanning lines, and a top gate coupled to one of the plurality of second scanning lines, and is configured to transfer a data signal of the data line to the second electrode under the control of a first scanning signal and a second scanning signal.

20 Claims, 13 Drawing Sheets

(51) Int. Cl.
*G02F 1/1343* (2006.01)
*H01L 27/12* (2006.01)
*H01L 49/02* (2006.01)
*H01L 29/786* (2006.01)
*G09G 3/36* (2006.01)

(52) U.S. Cl.
CPC .. *G02F 1/136209* (2013.01); *G02F 1/136286* (2013.01); *G09G 3/3648* (2013.01); *H01L 27/124* (2013.01); *H01L 27/1255* (2013.01); *H01L 27/1288* (2013.01); *H01L 28/40* (2013.01); *H01L 29/78633* (2013.01); *H01L 29/78648* (2013.01); *G02F 2001/13685* (2013.01); *G02F 2001/136295* (2013.01); *G02F 2201/121* (2013.01); *G02F 2201/123* (2013.01); *G09G 2300/0413* (2013.01); *G09G 2300/0809* (2013.01); *G09G 2310/021* (2013.01); *G09G 2320/0257* (2013.01); *G09G 2330/021* (2013.01)

(58) Field of Classification Search
CPC ...... G09G 2320/0257; G09G 2330/021; G02F 1/13624; G02F 1/134363; G02F 1/1368; G02F 1/136209; G02F 1/136286; G02F 1/1362; G02F 1/136213; G02F 1/136; G02F 2201/121; G02F 2201/123; G02F 2001/13685; G02F 2001/136295; H01L 28/40; H01L 29/78648; H01L 29/78633

See application file for complete search history.

(56) References Cited

U.S. PATENT DOCUMENTS

| | | | |
|---|---|---|---|
| 9,885,901 B2 | 2/2018 | Xu | |
| 10,050,151 B2 | 8/2018 | Niu et al. | |
| 2003/0231152 A1* | 12/2003 | Shin | G09G 3/3241 345/83 |
| 2004/0263760 A1* | 12/2004 | Kodate | G02F 1/13624 349/151 |
| 2012/0007084 A1* | 1/2012 | Park | H01L 27/1225 257/59 |
| 2012/0212061 A1 | 8/2012 | Takatsuka | |
| 2013/0147783 A1* | 6/2013 | Yamauchi | G09G 3/3614 345/212 |
| 2013/0157399 A1 | 6/2013 | Park et al. | |
| 2015/0205156 A1 | 7/2015 | Xu | |
| 2017/0213916 A1 | 7/2017 | Niu et al. | |

FOREIGN PATENT DOCUMENTS

| | | |
|---|---|---|
| CN | 105741779 A | 7/2016 |
| CN | 102315278 B | 8/2016 |
| CN | 106098786 A | 11/2016 |

\* cited by examiner

ARRAY SUBSTRATE AND DRIVING METHOD AND MANUFACTURING METHOD THEREOF

CROSS-REFERENCE TO RELATED APPLICATION(S)

This application claims priority to the Chinese Patent Application No. CN201810134567.6, filed on Feb. 9, 2018, which is incorporated herein by reference in its entirety.

TECHNICAL FIELD

The present disclosure relates to the field of display technologies, and more particularly, to an array substrate, a driving method and a manufacturing method thereof, a display panel, and a display apparatus.

BACKGROUND

Liquid Crystal Displays (LCDs) have advantages such as low radiation, a small volume, and low energy consumption etc., and are widely used in electronic products such as notebook computers, flat-panel televisions, or mobile phones etc.

Currently, multiple types of liquid crystal displays have developed, for example, a Twisted Nematic (TN) type of liquid crystal displays, an Advanced super-Dimensional field Switch (ADS) type of liquid crystal displays, a High Aperture ratio and advanced super-Dimensional field Switch (HADS) type of liquid crystal displays and an In-Plane Switch (IPS) type of liquid crystal displays, which have different driving modes and display effects and have respective advantages.

In the various types of liquid crystal displays, the ADS type of liquid crystal displays have common electrodes and pixel electrodes provided on an array substrate, and are widely used because of its advantages such as a wide viewing angle, a high aperture ratio, a high transmittance etc. In the ADS technology, a multi-dimensional electric field is primarily formed by an electric field generated at an edge of slit electrodes in the same plane and an electric field generated between a slit electrode layer and a plate electrode layer, so that all liquid crystal molecules in all directions between slit electrodes and right above the electrodes in a liquid crystal cell, thereby improving an operation efficiency of liquid crystal and increasing an light transmission efficiency. The ADS technology can improve image quality of TFT-LCD products, and has advantages such as a high resolution, a high transmittance, a low power consumption, a wide viewing angle, a high aperture ratio, a low chromatic aberration, and free of push mura etc. The HADS is an important implementation form in the ADS technology and achieves a higher aperture ratio.

SUMMARY

Embodiments of the present disclosure provide an array substrate, a driving method and a manufacturing method thereof, a display panel, and a display apparatus.

According to a first aspect of the present disclosure, there is provided an array substrate, comprising: a base, a plurality of first scanning lines, a plurality of second scanning lines, a plurality of data lines, a common electrode line, and a plurality of pixel units. Each of the pixel units comprises: a first electrode, a second electrode, a switch transistor, a shared transistor and a shared capacitor. The switch transistor has a first terminal coupled to the second electrode, a second terminal coupled to one of the plurality of data lines, a bottom gate coupled to one of the plurality of first scanning lines, and a top gate coupled to one of the plurality of second scanning lines, and configured to transfer a data signal of the data line to the second electrode under the control of a first scanning signal of the first scanning line and a second scanning signal of the second scanning line. The shared transistor has a first terminal coupled to a second electrode of an immediately next row of pixel units, and a gate coupled to the bottom gate or the top gate of the switch transistor. The shared capacitor comprises a first capacitor coupled between the common electrode line and a second terminal of the shared transistor.

In an embodiment of the present disclosure, the shared capacitor further comprises a second capacitor. The second capacitor is coupled between the second terminal of the shared transistor and a floating line, and the floating line is provided in the same layer as that of the top gate of the switch transistor.

In an embodiment of the present disclosure, first electrodes of the plurality of pixel units are electrodes which are continuously distributed in the entire plane.

In an embodiment of the present disclosure, first electrodes of the plurality of pixel units are separated from each other, wherein the array substrate further comprises a connection layer, wherein the connection layer is provided in the same layer as that of the top gate of the switch transistor, and is configured to couple the first electrodes of the plurality of pixel units.

In an embodiment of the present disclosure, in a case that the gate of the shared transistor is coupled to the bottom gate of the switch transistor, orthographic projections of the first terminal and the second terminal of the shared transistor on the base fall within an orthographic projection range of an active layer of the shared transistor on the base, and orthographic projections of the first terminal, the second terminal and the active layer of the shared transistor on the base fall within an orthographic projection range of the gate of the shared transistor on the base.

In an embodiment of the present disclosure, in a case that the gate of the shared transistor is coupled to the top gate of the switch transistor, the array substrate further comprises a shielding layer which is provided in the same layer as that of the bottom gate of the switch transistor. Orthographic projections of the first terminal, the second terminal and the gate of the shared transistor on the base fall within an orthographic projection range of an active layer of the shared transistor on the base, and orthographic projections of the first terminal, the second terminal, the gate, and the active layer of the shared transistor on the base fall within an orthographic projection range of the shielding layer on the base.

In an embodiment of the present disclosure, orthographic projections of the first terminal and the second terminal of the switch transistor on the base are at least partially overlapped with an orthographic projection of the top gate of the switch transistor on the base. The orthographic projection of the top gate of the switch transistor on the base falls within an orthographic projection range of an active layer of the switch transistor on the base. Orthographic projections of the first terminal, the second terminal, the top gate, and the active layer of the switch transistor on the base fall within an orthographic projection range of the bottom gate of the switch transistor on the base.

According to a second aspect of the present disclosure, there is provided a method for driving the array substrate according to the embodiment of the present disclosure. In this method, a high level signal is provided to bottom gates of switch transistors of an $n^{th}$ row of pixel units, and a low level signal is provided to top gates of the switch transistors, so that second electrodes of the $n^{th}$ row of pixel units are turned on, and charges of shared capacitors of the $n^{th}$ row of pixel units and charges of second electrodes of an $(n+1)^{th}$ row of pixel units are neutralized. A high level signal is provided to bottom gates of switch transistors of the $(n+1)^{th}$ row of pixel units, and a low level signal is provided to top gates of the switch transistors, so that the second electrodes of the $(n+1)^{th}$ row of pixel units are turned on, and voltages of the shared capacitors of the $n^{th}$ row of pixel units are maintained to be unchanged. Voltages of the second electrodes of the $(n+1)^{th}$ row of pixel units are maintained to be unchanged.

According to a third aspect of the present disclosure, there is provided a method for manufacturing an array substrate. In this method, a first conductive layer is formed on a base, and the first conductive layer is patterned to form first scanning lines, a common electrode line, first terminals of first capacitors, and bottom gates of switch transistors. A first insulating layer is formed on the first conductive layer. A semiconductor layer is formed on the first insulating layer. A second conductive layer is formed on the semiconductor layer, and the second conductive layer is patterned to form data lines, first terminals and second terminals of the switch transistors, first terminals and second terminals of shared transistors, and second terminals of the first capacitors. A second insulating layer is formed on the second conductive layer. A third conductive layer is formed on the second insulating layer, and the third conductive layer is patterned to form second scanning lines, and top gates of the switch transistors. A third insulating layer is formed on the third conductive layer. The first conductive layer or the third conductive layer is patterned to form gates of the shared transistors.

In an embodiment of the present disclosure, a first transparent conductive layer is formed on the second conductive layer, the first transparent conductive layer is patterned to form second electrodes, and the second insulating layer is formed on the first transparent conductive layer. A second transparent conductive layer is formed on the third insulating layer, and the second transparent conductive layer is patterned to form first electrodes.

In an embodiment of the present disclosure, a first transparent conductive layer is formed on the base, the first transparent conductive layer is patterned to form a plurality of first electrodes, and the first conductive layer is formed on the first transparent conductive layer. A second transparent conductive layer is formed on the third insulating layer, and the second transparent conductive layer is patterned to form second electrodes. The third conductive layer is patterned to form a connection layer through which the plurality of first electrodes are coupled.

In an embodiment of the present disclosure, the second conductive layer is patterned to form first terminals of second capacitors. The third conductive layer is patterned to form a floating line and second terminals of the second capacitors.

According to a fourth aspect of the present disclosure, there is provided a display panel, comprising the array substrate according to the first aspect of the present disclosure.

In an embodiment of the present disclosure, the shared capacitor further comprises a second capacitor. The second capacitor is coupled between the second terminal of the shared transistor and a floating line. The floating line is provided in the same layer as that of the top gate of the switch transistor.

In an embodiment of the present disclosure, first electrodes of the plurality of pixel units are electrodes which are continuously distributed in the entire plane.

In an embodiment of the present disclosure, first electrodes of the plurality of pixel units are separated from each other, wherein the array substrate further comprises a connection layer, wherein the connection layer is provided in the same layer as that of the top gate of the switch transistor, and is configured to couple the first electrodes of the plurality of pixel units.

In an embodiment of the present disclosure, in a case that the gate of the shared transistor is coupled to the bottom gate of the switch transistor, orthographic projections of the first terminal and the second terminal of the shared transistor on the base fall within an orthographic projection range of an active layer of the shared transistor on the base, and orthographic projections of the first terminal, the second terminal and the active layer of the shared transistor on the base falls within an orthographic projection range of the gate of the shared transistor on the base.

In an embodiment of the present disclosure, in a case that the gate of the shared transistor is coupled to the top gate of the switch transistor, the array substrate further comprises a shielding layer which is provided in the same layer as that of the bottom gate of the switch transistor. Orthographic projections of the first terminal, the second terminal and the gate of the shared transistor on the base fall within an orthographic projection range of an active layer of the shared transistor on the base, and orthographic projections of the first terminal, the second terminal, the gate, and the active layer of the shared transistor on the base fall within an orthographic projection range of the shielding layer on the base.

In an embodiment of the present disclosure, orthographic projections of the first terminal and the second terminal of the switch transistor on the base are at least partially overlapped with an orthographic projection of the top gate of the switch transistor on the base. Orthographic projection of the top gate of the switch transistor on the base falls within an orthographic projection range of an active layer of the switch transistor on the base. Orthographic projections of the first terminal, the second terminal, the top gate, and the active layer of the switch transistor on the base fall within an orthographic projection range of the bottom gate of the switch transistor on the base.

According to a fifth aspect of the present disclosure, there is provided a display apparatus, comprising the display panel according to the fourth aspect of the present disclosure.

BRIEF DESCRIPTION OF THE DRAWINGS

In order to more clearly illustrate the technical solutions of the present disclosure, the accompanying drawings of the embodiments will be briefly described below. It is to be understood that the accompanying drawings described below are only some embodiments of the present disclosure, instead of limiting the present disclosure, and in the accompanying drawings.

FIG. 2b is cross-sectional views along A-A', B-B' and C-C' in FIG. 2a;

FIG. 3b is cross-sectional views along A-A', B-B' and C-C' in FIG. 3a;

FIG. 4b is a cross-sectional view along C-C' in FIG. 4a;

FIG. 7b is cross-sectional views along A-A' and B-B' in FIG. 7a;

FIG. 8b is cross-sectional views along A-A', B-B' and C-C' in FIG. 8a;

DETAILED DESCRIPTION

In order to make the purposes, technical solutions and advantages of the embodiments of the present disclosure more clear, the technical solutions according to the embodiments of the present disclosure will be clearly and completely described below in conjunction with the accompanying drawings. It is apparent that the described embodiments are only a part of the embodiments of the present disclosure, and not all of the embodiments. All other embodiments obtained by those of ordinary skill in the art based on the described embodiments without any creative work are also within the scope of the present disclosure.

Hereinafter, an expression "an element A is coupled to an element B" means that the element A is "directly" connected to the element B or is "indirectly" connected to the element B through one or more other elements, unless otherwise stated.

In most of the TFT-LCD display panels in the related art, a switch transistor TFT is controlled by a single gate. However, for a display panel having a high resolution and a high refresh rate, this may result in insufficient charging of a pixel electrode. Although a gate voltage of the TFT may be increased to increase on-state current of the TFT, it also leads to an increase in power consumption, which may in turn result in that an output voltage range of a driving circuit is exceeded.

The embodiments of the present disclosure provide an array substrate using a dual-gate thin film transistor, a driving method and a manufacturing method thereof, a display panel, and a display apparatus, which realize charge sharing before charging a pixel unit, and can reduce power consumption and improve driving stability. In addition, the present disclosure can also increase a charging rate and improve a poor display phenomenon such as splash screen, afterimage etc.

Figure 1:
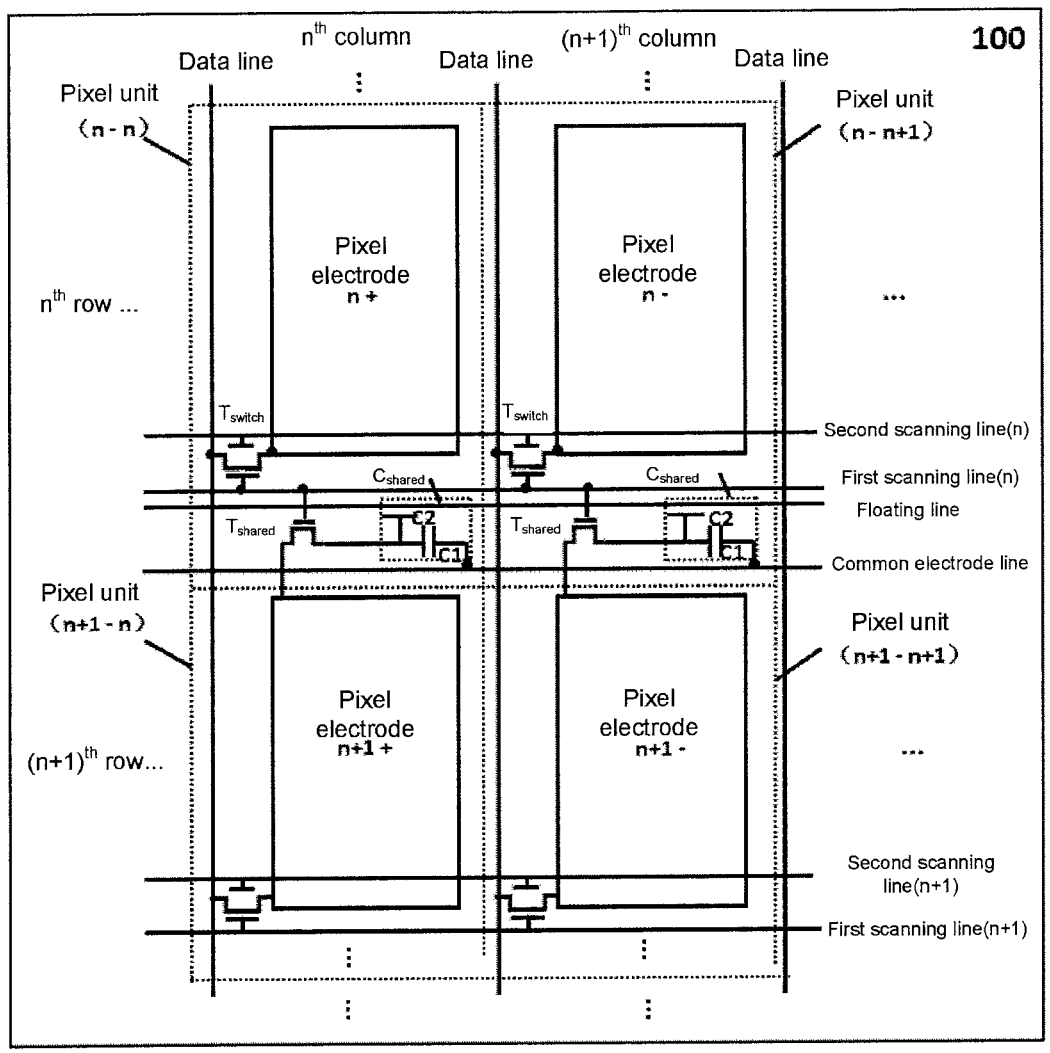
FIG. 1 is a schematic view of an array substrate according to an embodiment of the present disclosure.

FIG. 1 illustrates a schematic view of an array substrate 100 according to an embodiment of the present disclosure. As shown in FIG. 1, the array substrate 100 may comprise a plurality of pixel units, a plurality of first scanning lines, a plurality of second scanning lines, a plurality of data lines, a common electrode line, and a base (not shown).

As shown in FIG. 1, the plurality of pixel units, for example, a pixel unit (n–n), a pixel unit (n–n+1), a pixel unit (n+1–n), and a pixel unit (n+1–n+1)) may be arranged into a matrix. Each of the pixel units may comprise a common electrode (which may also be referred to as a first electrode), a pixel electrode (which may also be referred to as a second electrode), a switch transistor $T_{switch}$, a shared transistor $T_{share}$, and a shared capacitor $C_{share}$. The pixel electrode may be made of a transparent conductive material (for example ITO).

In an embodiment of the present disclosure, the switch transistor $T_{switch}$ is a dual-gate transistor, for example, a dual-gate Thin Film Transistor (TFT). The switch transistor $T_{switch}$ comprises a bottom gate, a top gate, a source, and a drain. As the source and the drain of the transistor have symmetry, they may not be specifically distinguished, and a first terminal represents the source (or the drain) and a second terminal represents the drain (or the source). As shown in FIG. 1, the switch transistor $T_{switch}$ has the first terminal coupled to the pixel electrode, the second terminal coupled to a data line, the bottom gate coupled to a first scanning line, and the top gate coupled to a second scanning line. The switch transistor $T_{switch}$ may transfer a data signal from the data line to the pixel electrode under the control of a first scanning signal of the first scanning line and a second scanning signal of the second scanning line. With the switch transistor having a dual-gate structure, the stability of the array substrate can be improved, the turn-on voltage can be reduced, and the on-state current can be increased.

The shared transistor $T_{shared}$ has a first terminal coupled to a pixel electrode of an immediately next row of pixel units, a second terminal coupled to the shared capacitor $C_{shared}$, and a gate coupled to the bottom gate of the switch transistor $T_{switch}$.

The shared capacitor $C_{shared}$ is coupled between the common electrode line and the second terminal of the shared transistor $T_{shared}$. In an embodiment of the present disclosure, the shared capacitor $C_{shared}$ may comprise a first capacitor C1. The first capacitor C1 has a first terminal coupled to the common electrode line, and a second terminal coupled to the second terminal of the shared transistor $T_{shared}$.

Further, in an embodiment of the present disclosure, the shared capacitor $C_{shared}$ may further comprise a second capacitor C2. The second capacitor C2 is coupled between a floating line and the second terminal of the shared transistor $T_{shared}$. In an embodiment of the present disclosure, the floating line is provided in the same layer as that of the top gate of the switch transistor, and may be made of a metal material. In one embodiment, one plate of the second capacitor C2 may be formed using the floating line. In this case, the shared capacitor $C_{shared}$ is actually formed by connecting the first capacitor C1 in parallel with the second capacitor C2, which can increase a capacitance value of the shared capacitor $C_{shared}$. As pixel electrodes of two adjacent pixel units in the same row of pixel units have opposite polarities, a total amount of charges induced on the floating line is zero, and therefore no bias is formed.

In an embodiment of the present disclosure, the array substrate 100 may be implemented using the HADS technology and the ADS technology, respectively. In an HADS type of array substrate, a common electrode is formed on a pixel electrode. The HADS type of array substrate has a higher aperture ratio and is suitable for mobile products. In an ADS type of array substrate, a pixel electrode is formed on a common electrode. For the ADS type of array substrate, as the common electrode does not cover data lines and scanning lines, a load of the data lines and the scanning lines is relatively small, and the ADS type of array substrate is more suitable for a large-sized design. The two types of array substrates will be described in detail below.

Figure 2A:
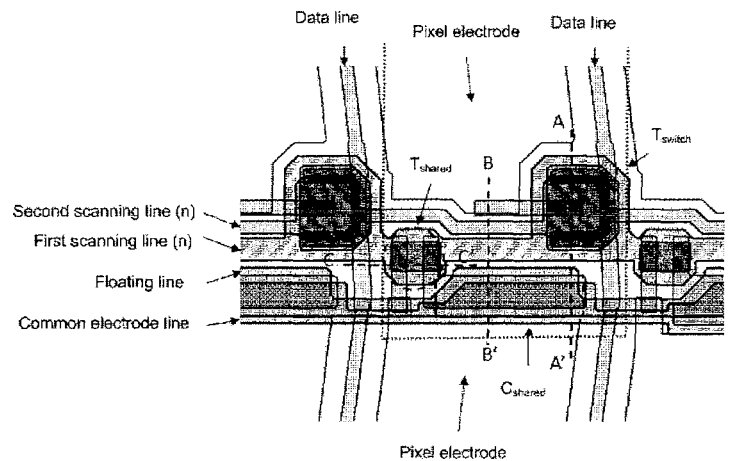
FIG. 2a is a top view of a portion of an array substrate implemented using the HADS technology according to an embodiment of the present disclosure.

FIG. 2a illustrates a top view of an array substrate implemented using the HADS technology according to an embodiment of the present disclosure. As shown in FIG. 2a, first scanning lines, second scanning lines, and a common electrode line are located between two rows of pixel units, and extend in a first direction. Data lines are located between two columns of pixel units and extend in a second direction. In the present embodiment, common electrodes (not shown) cover the entire array substrate, and may be made of a transparent conductive material such as Indium Tin Oxide (ITO). As an example, the first direction may be a row direction and the second direction may be a column direction, and vice versa. Hereinafter, the present disclosure will be described by taking the first direction being the row direction and the second direction being the column direction as an example.

In FIG. 2a, a switch transistor, a shared transistor, and a shared capacitor may be provided within an orthographic projection range of a non-display area on a short side of a pixel electrode. Thereby, a small aperture loss can be achieved, for example about 4%.

Figure 2B:
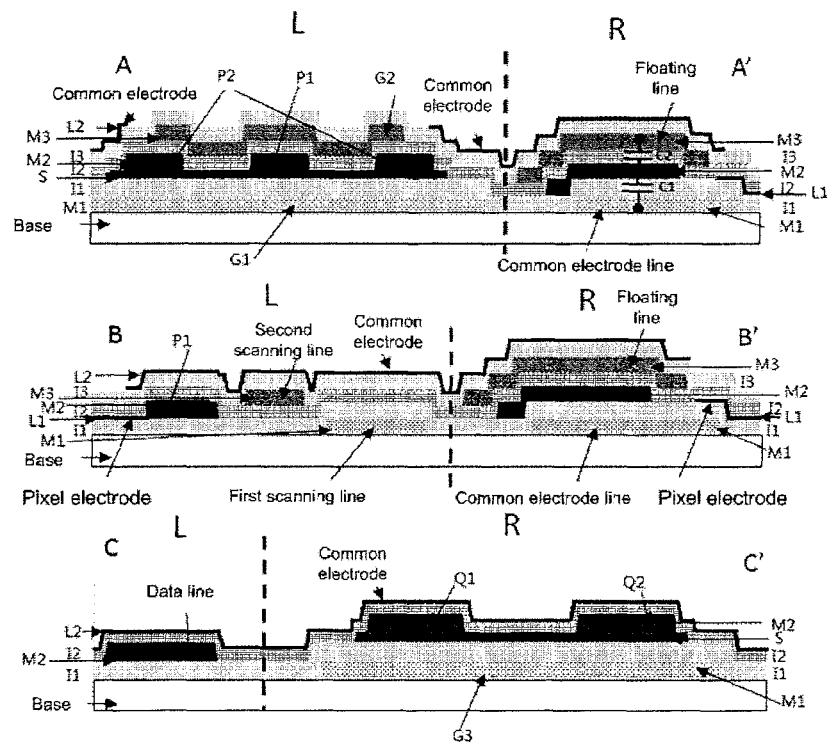

FIG. 2b illustrates cross-sectional views along A-A', B-B' and C-C' in FIG. 2a. The cross-sectional view along A-A' illustrates a cross section through a switch transistor and a shared capacitor of a pixel unit, the cross-sectional view along BB' illustrates a cross section through a pixel electrode, a second scanning line, a first scanning line, and the shared capacitor of the pixel unit, and the cross-sectional view along CC' illustrates a cross section through a shared transistor of the pixel unit.

A portion L of the cross-sectional view along A-A' schematically illustrates a cross-sectional view of the switch transistor. As shown, the switch transistor has a bottom gate G1 formed in a first conductive layer M1, a top gate G2 formed in a third conductive layer M3, and a first terminal P1 and a second terminal P2 formed in a second conductive layer M2. An active layer of the switch transistor is formed in a semiconductor layer S. Further, a first insulating layer I1 is provided between the first conductive layer M1 and the semiconductor layer S. A second insulating layer I2 is provided between the second conductive layer M2 and the third conductive layer M3. A third insulating layer I3 is provided on the third conductive layer M3.

A portion R of the cross-sectional view along A-A' schematically illustrates a cross-sectional view of the shared capacitor. As shown, the shared capacitor comprises a first capacitor C1 and a second capacitor C2. A common electrode line located in the first conductive layer M1 may form a first terminal of the first capacitor C1. The second conductive layer M2 may form a second terminal of the first capacitor C1 and a first terminal of the second capacitor C2. A floating line in the third conductive layer M3 may form a second terminal of the second capacitor C2. Further, the first insulating layer I1 is provided between the first conductive layer M1 and the second conductive layer M2, and the second insulating layer I2 is provided between the second conductive layer M2 and the third conductive layer M3.

As shown in a portion L of the cross-sectional view along BB', the first scanning line is formed in the first conductive layer M1, the first terminal P1 of the switch transistor is formed in the second conductive layer M2, the pixel electrode is formed in a first transparent conductive layer L1, the second scanning line is formed in the third conductive layer M3, and the common electrode is formed in a second transparent conductive layer L2. In the present embodiment, common electrodes of all the pixel units are electrodes which are continuously distributed in the entire plane. As shown in the cross-sectional view along B-B', the first terminal P1 of the switch transistor is electrically connected to the pixel electrode. Further, orthographic projections of the first scanning line and the second scanning line are not overlapped with each other, and therefore, a parasitic capacitor is not generated, so that a load of the first scanning line is not increased.

A portion R of the cross-sectional view along B-B' illustrates a cross-sectional structure of the shared capacitor, which is the same as that of the portion R of the cross-sectional view along A-A', and the description thereof is omitted here.

As shown in a portion L of the cross-sectional view along C-C', a data line is formed in the second conductive layer M2.

A portion R of the cross-sectional view along C-C' schematically illustrates a cross-sectional view of the shared transistor. The shared transistor has a gate G3 formed in the first conductive layer M1, and a first terminal Q1 and a second terminal Q2 formed in the second conductive layer M2. An active layer of the shared transistor is formed in the semiconductor layer S.

As can be seen from FIG. 2b, the bottom gate G1 of the switch transistor is provided in the same layer as that of the common electrode line, and the top gate G2 of the switch transistor is provided in the same layer as that of the floating line. In the embodiment of the present disclosure, "the same layer" refers to a layer structure formed by using the same mask through a single patterning process after forming film layers for forming particular patterns through the same film forming process. Depending on different particular patterns, a single patterning process may comprise multiple exposure, development, or etching processes, particular patterns in the formed layer structure may be continuous or discontinuous, and these particular patterns may also be at different heights or have different thicknesses.

Therefore, the array substrate implemented using the HADS technology has a stack structure including the following layers from bottom to top: a first conductive layer M1, a first insulating layer I1, a semiconductor layer S, a second conductive layer M2, a first transparent conductive layer L1, a second insulating layer I2, a third conductive layer M3, a third insulating layer I3, and a second transparent conductive layer L2. The first scanning line, the common electrode line, the first terminal of the first capacitor C1, the bottom gate G1 of the switch transistor, and the gate G3 of the shared transistor are formed in the first conductive layer M1. The active layer is formed in the semiconductor layer S. The data line, the first terminal P1 and the second terminal P2 of the switch transistor, the first terminal Q1 and the second terminal Q2 of the shared transistor, the second terminal of the first capacitor C1, and the first terminal of the second capacitor C2 are formed in the second conductive layer M2. The pixel electrode is formed in the first transparent conductive layer L1. The second scanning line, the floating line, the second terminal of the second capacitor C2, and the top gate G2 of the switch transistor are formed in the third conductive layer M3. The common electrode is formed in the second transparent conductive layer L2.

In an embodiment of the present disclosure, orthographic projections of the first terminal P1 and the second terminal P2 of the switch transistor on the base are at least partially overlapped with an orthographic projection of the top gate G2 of the switch transistor on the base, and the orthographic projection of the top gate G2 of the switch transistor on the base falls within an orthographic projection range of the active layer of the switch transistor on the base. Thereby, the load can be reduced while achieving the same control effect on the channel.

Further, in an embodiment of the present disclosure, orthographic projections of the first terminal P1, the second terminal P2, the top gate G2, and the active layer of the switch transistor on the base fall within an orthographic projection range of the bottom gate G1 of the switch transistor on the base. In this way, leak current due to backlight irradiation can be prevented.

On the other hand, orthographic projections of the first terminal Q1 and the second terminal Q2 of the shared transistor on the base fall within an orthographic projection range of the active layer of the shared transistor on the base, and orthographic projections of the first terminal Q1, the second terminal Q2 and the active layer of the shared transistor on the base fall within an orthographic projection range of the gate G3 of the shared transistor on the base. In this way, leak current due to backlight irradiation can also be prevented.

Figure 3A:
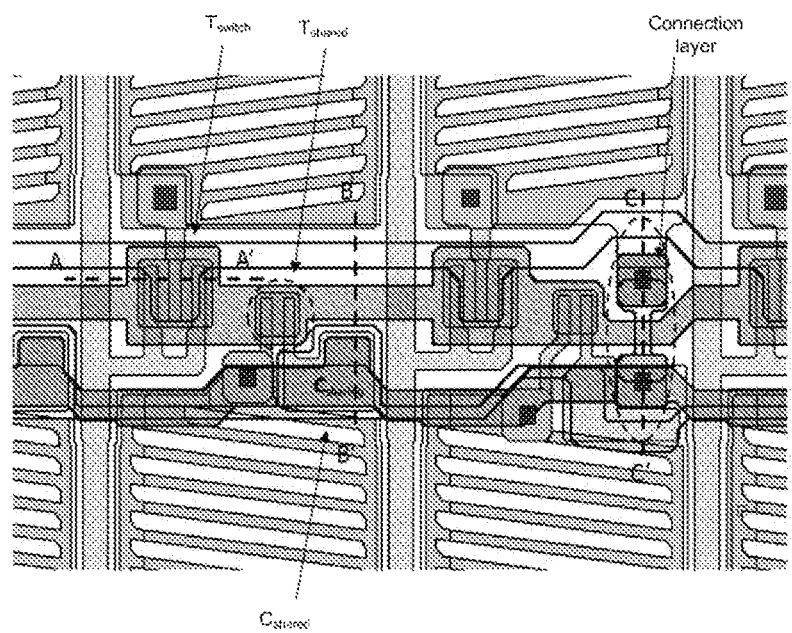
FIG. 3a is a top view of a portion of an array substrate implemented using the ADS technology according to an embodiment of the present disclosure.

FIG. 3a illustrates a top view of an array substrate implemented using the ADS technology according to an embodiment of the present disclosure. On the basis of the array substrate of FIG. 2a, the array substrate of FIG. 3a may comprise a plurality of common electrodes which are provided separately. Each of the common electrodes corresponds to one pixel unit in the array substrate. As the common electrode does not cover a data line and two scanning lines, a load of the data line and the two scanning lines is relatively small. As shown in FIG. 3a, the array substrate further comprises a connection layer provided in the same layer as that of the top gate G2 of the switch transistor and configured to couple a plurality of common electrodes. As a layout shape of the pixel electrodes is different from that of the pixel electrodes in FIG. 2a, it needs to adaptively adjust an arrangement of the switch transistors, the shared transistors, and the shared capacitors. In addition, a layout of the ADS type of array substrate shown in FIG. 3a is substantially the same as that of the HADS type of array substrate shown in FIG. 2a, and details will not be described herein again.

Figure 3B:
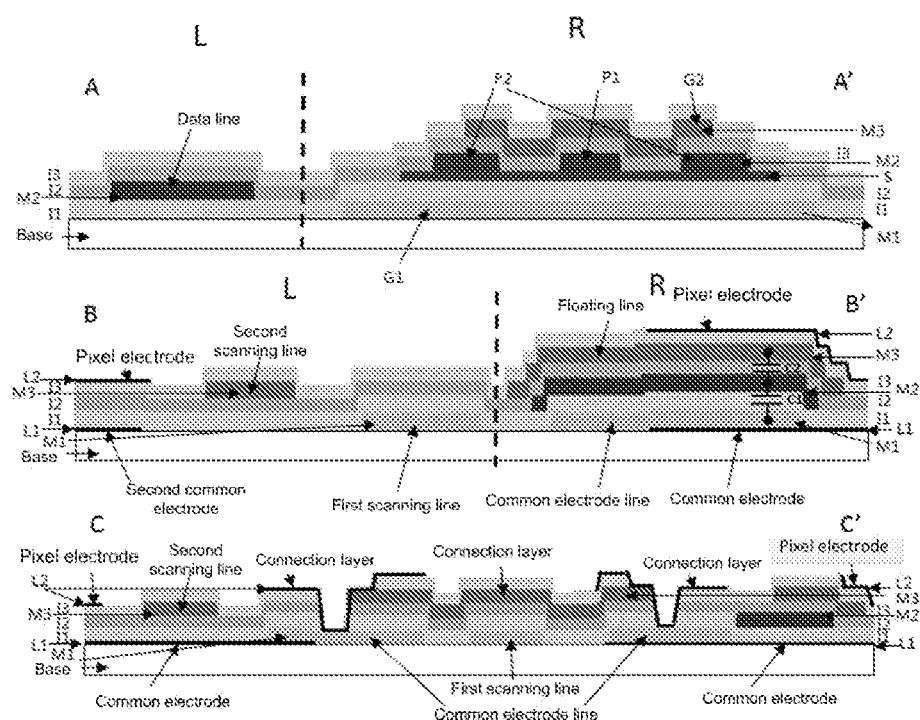

FIG. 3b illustrates cross-sectional views along A-A', B-B' and C-C' in FIG. 3a. The cross-sectional view along A-A' illustrates a cross section through a switch transistor of a pixel unit, the cross-sectional view along BB' illustrates a cross section through a second scanning line, a first scanning line, and a shared capacitor of the pixel unit, and the cross-sectional view along C-C' illustrates a cross section through a connection layer of the pixel unit.

As shown in a portion L of the cross-sectional view along A-A', the data line is formed in a second conductive layer M2.

A portion R of the cross-sectional view along A-A' schematically illustrates a cross-sectional view of a switch transistor $T_{switch}$, which is similar to the portion L of the cross-sectional view along A-A' in FIG. 2b, and the description thereof will be omitted here.

As shown in a portion L of the cross-sectional view along BB', a common electrode is formed in a first transparent conductive layer L1, a first scanning line is formed in a first conductive layer M1, a second scanning line is formed in a third conductive layer M3, and a pixel electrode is formed in a second transparent conductive layer L2. In the present embodiment, common electrodes of different pixel units are independent of each other to prevent the common electrode from being connected to the first scanning line formed in the first conductive layer M1. Further, orthographic projections of the first scanning line and the second scanning line are not overlapped with each other, and therefore no parasitic capacitor is generated, and thus the load of the first scanning line (the bottom gate of the switch transistor) is not increased.

A portion R of the cross-sectional view along B-B' illustrates a cross-sectional structure of the shared capacitor, which is the same as the portion R of the cross-sectional view along A-A' in FIG. 2b, and the description thereof is omitted here.

Figure 4A:
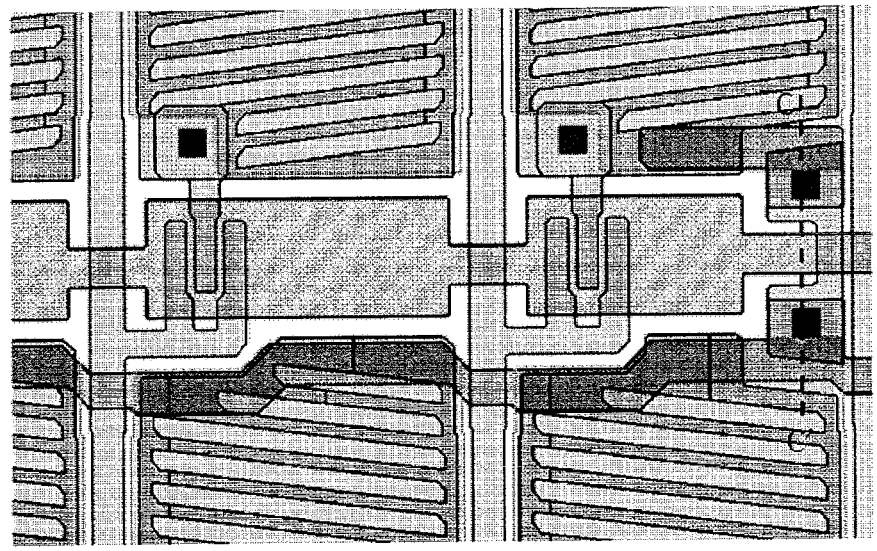
FIG. 4a is a top view of a portion of an array substrate implemented using the ADS technology according to an embodiment of the present disclosure.
Figure 4B:
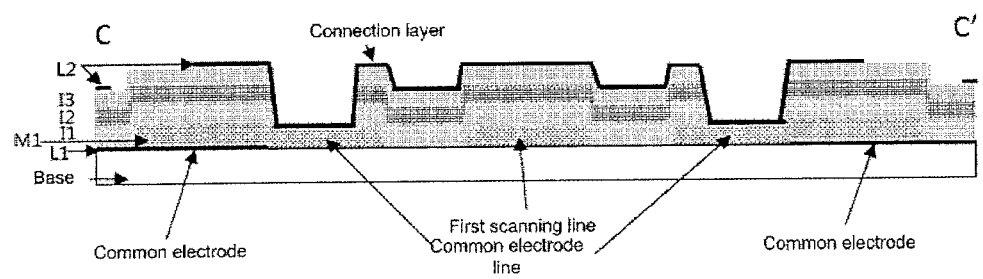

As shown, as the common electrodes in different pixel units are independent of each other, it usually needs to provide a connection layer to achieve bridging through via holes. FIG. 4a illustrates a top view of a portion of an existing array substrate implemented using the ADS technology, and FIG. 4b illustrates a cross-sectional view along C-C' in FIG. 4a according to an embodiment of the present disclosure. As shown, a connection layer is formed using the second transparent conductive layer L2 to perform bridging among the common electrodes. However, as the connection layer formed in the transparent conductive layer has very large resistance, for example, the resistance of the connection layer of a transparent material is 650 times that of a connection layer of a metal material which has the same area as that of the connection layer of a transparent material, a resistance gradient change of the common electrodes from a proximal end to a distal end is formed in the entire panel. However, the uneven voltages of the common electrodes is easy to cause a poor display phenomenon such as green screen, afterimage etc.

In order to reduce the resistance of the connection layer formed in the transparent conductive layer, in the embodiment of the present disclosure, the array substrate further comprises a connection layer, which is provided in the same layer as that of the top gate of the switch transistor and is configured to couple the common electrodes of the plurality of pixel units. Specifically, as shown in the cross-sectional view along C-C' in FIG. 3b, the common electrodes of the plurality of pixel units are coupled by a connection layer in the third conductive layer M3 and a connection layer in the second transparent conductive layer L2. Thus, by using the connection layer located in the third conductive layer M3 (for example, made of a metal material), an area of the connection layer formed in the second transparent conductive layer L2 can be reduced, thereby significantly reducing the resistance of the common electrodes.

Therefore, the array substrate implemented using the ADS technology has a stack structure including the following layers from bottom to top: a first transparent conductive layer L1, a first conductive layer M1, a first insulating layer I1, a semiconductor layer S, a second conductive layer M2, a second insulating layer I2, a third conductive layer M3, a third insulating layer I3, and a second transparent conductive layer L2. The plurality of common electrodes are formed in the first transparent conductive layer L1. The first scanning line, the common electrode line, the first terminal of the first capacitor C1, the bottom gate G1 of the switch transistor, and the gate G3 of the shared transistor are formed in the first conductive layer M1. The active layer is formed in the semiconductor layer S. The data line, the first terminal P1 and the second terminal P2 of the switch transistor, the first terminal Q1 and the second terminal Q2 of the shared transistor, the second terminal of the first capacitor C1 and the first terminal of the second capacitor C2 are formed in the second conductive layer M2. The second scanning line, the floating line, the second terminal of the second capacitor C2, the top gate G2 of the switch transistor, and the connection layer are formed in the third conductive layer M3. The pixel electrode is formed in the second transparent conductive layer L2.

In an embodiment of the present disclosure, orthographic projections of the first terminal P1 and the second terminal P2 of the switch transistor on the base are at least partially overlapped with an orthographic projection of the top gate G2 of the switch transistor on the base, and the orthographic projection of the top gate G2 of the switch transistor on the base falls within an orthographic projection range of the active layer of the switch transistor on the base. Thereby, the load can be reduced while achieving the same control effect on the channel.

Further, in an embodiment of the present disclosure, orthographic projections of the first terminal P1, the second terminal P2, the top gate G2 and the active layer of the switch transistor on the base fall within an orthographic projection range of the bottom gate G1 of the switch transistor on the base. In this way, leak current due to backlight irradiation can be prevented.

On the other hand, orthographic projections of the first terminal Q1 and the second terminal Q2 of the shared transistor on the base falls within an orthographic projection range of the active layer of the shared transistor on the base, and orthographic projections of the first terminal Q1, the second terminal Q2 and the active layer of the shared transistor on the base fall within an orthographic projection range of the gate G3 of the shared transistor on the base. In this way, leak current due to backlight irradiation can also be prevented.

Generally, for a pixel circuit using a single-gate transistor, when a high-level pulse signal VGH is provided to a gate, after a pixel electrode is charged completely, a pull-down voltage $\Delta Vp$ is formed for a voltage of the pixel electrode due to the coupling of capacitance Cgs. If the pull-down voltage $\Delta Vp$ is large, flicker and afterimage are likely to occur when positive and negative polarities are reversed.

Figure 5:
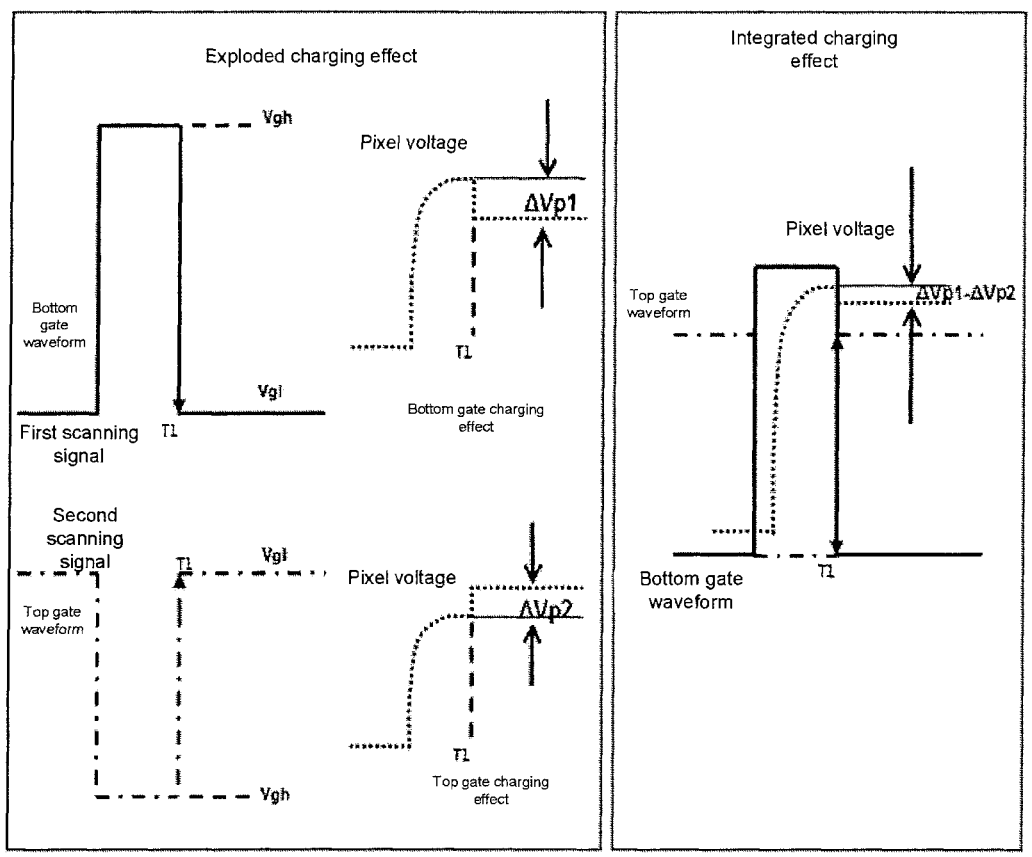
FIG. 5 is a schematic timing diagram of charging a pixel electrode by a dual-gate transistor in an array substrate according to an embodiment of the present disclosure.

In contrast, FIG. 5 illustrates a schematic timing diagram of charging a pixel electrode by a dual-gate transistor according to an embodiment of the present disclosure. As shown in an exploded charging effect portion of FIG. 5, when a high-level pulse signal is provided to a bottom gate, after a pixel electrode is charged completely, a first pull-down voltage $\Delta Vp1$ is formed for a voltage of the pixel electrode due to the coupling of capacitance Cgs. When a low-level pulse signal is provided to a top gate, after the pixel electrode is charged completely, a first pull-up voltage $\Delta Vp2$ is formed for the voltage of the pixel electrode due to the coupling of the capacitance Cgs.

As shown in the integrated charging effect portion of FIG. 5, a pull-down voltage $\Delta Vp$=the first pull-down voltage $\Delta Vp1$–the first pull-up voltage $\Delta Vp2$ (i.e., $\Delta Vp=\Delta Vp1-\Delta Vp2$). Therefore, the pull-down voltage $\Delta Vp$ can be reduced to even zero, thereby improving the stability of the voltage of the pixel electrode. Therefore, the array substrate according to the embodiment of the present disclosure can reduce the voltage of the VGH and increase the on-state current.

Figure 6:
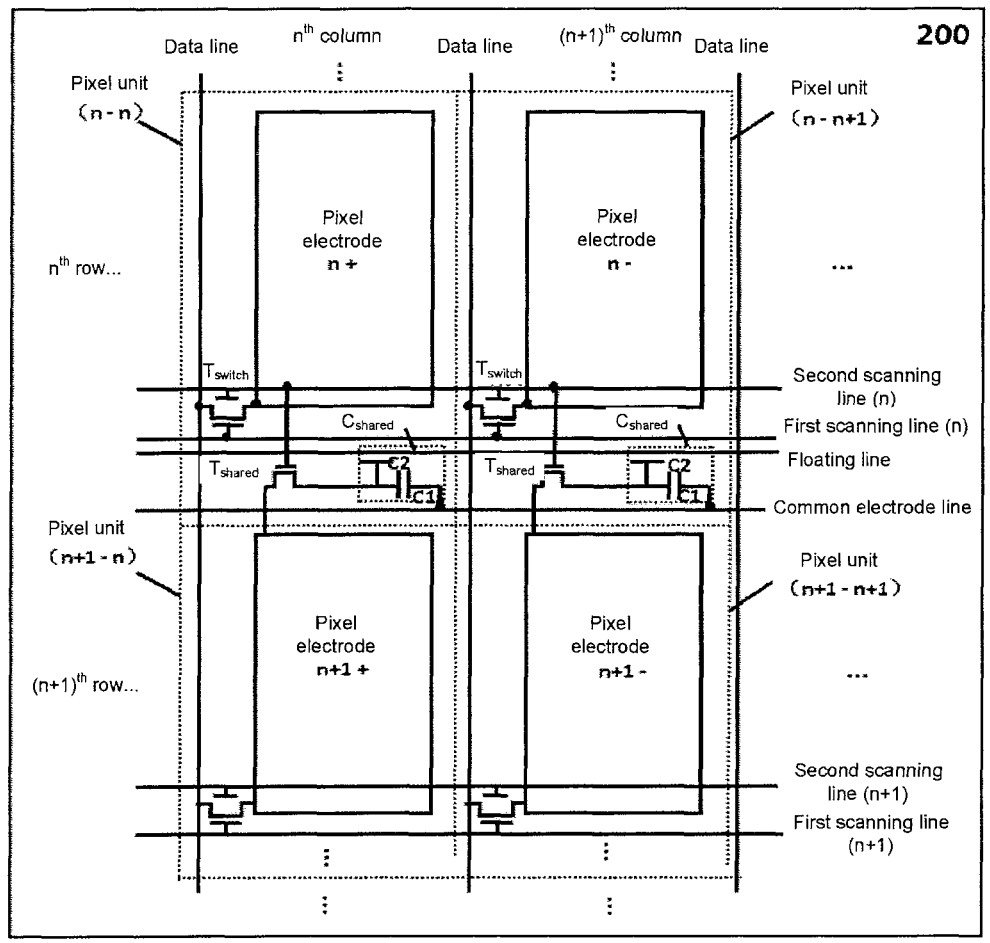
FIG. 6 is a schematic view of an array substrate according to another embodiment of the present disclosure.

FIG. 6 illustrates a schematic view of an array substrate 200 according to another embodiment of the present disclosure. In the array substrate 200, a gate G3 of a shared transistor in a pixel unit is coupled to a top gate G2 of a switch transistor. The gate G3 of the shared transistor is coupled to the top gate G2 of the switch transistor, which can reduce a load of a bottom gate G1 of the switch transistor and increase a load of the top gate G2, thereby equalizing capacitance of the bottom gate G1 and capacitance of the top gate G2. In this way, rising and falling edges of a pulse of the top gate G2 and a pulse of the bottom gate G1, which are fully symmetrical, can be better achieved. In addition, other portions of the array substrate 200 are configured to be the same as other portions of the array substrate 100, and the description thereof is omitted here.

In an embodiment of the present disclosure, the array substrate 200 may also be implemented using the HADS technology and the ADS technology, respectively. The two types of array substrates will be described in detail below.

Figure 7A:
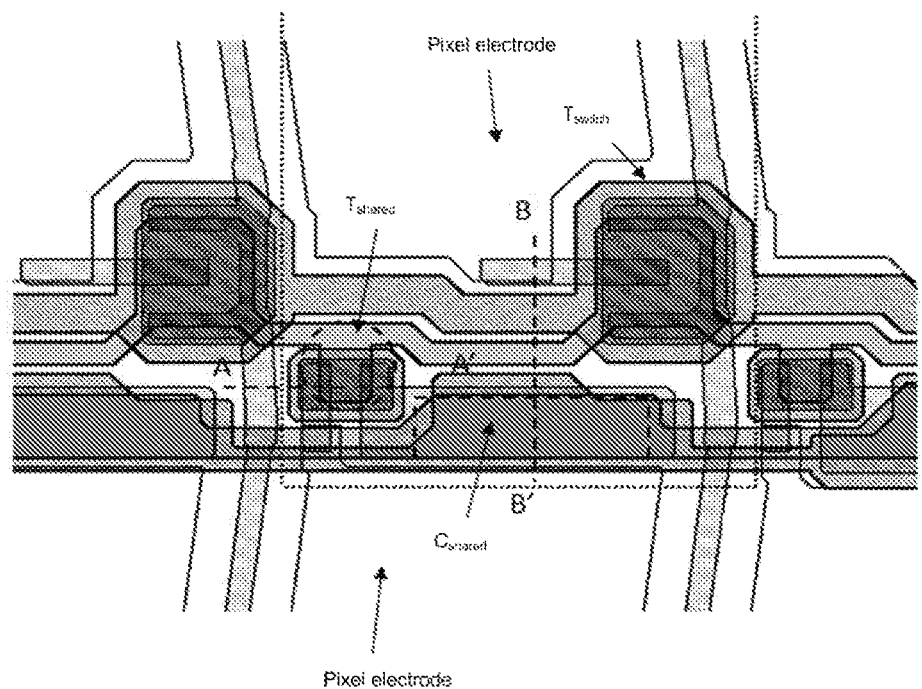
FIG. 7a is a top view of a portion of an array substrate implemented using the HADS technology according to an embodiment of the present disclosure.

FIG. 7a illustrates a top view of an array substrate implemented using the HADS technology according to an embodiment of the present disclosure. As shown in FIG. 7a, a layout of the array substrate is substantially the same as that of the array substrate shown in FIG. 2a, and only corresponding connection lines are adjusted without sacrificing the aperture ratio and the manufacturing yield of the array substrate.

Figure 7B:
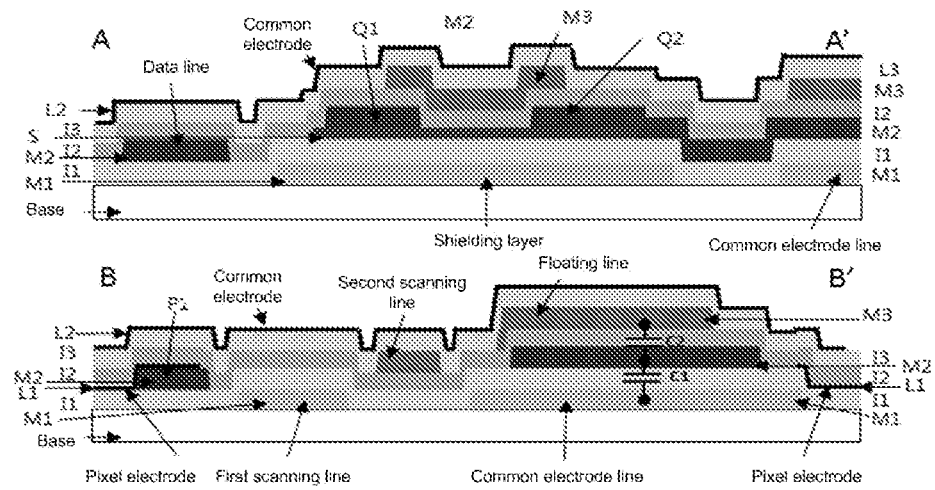

FIG. 7b illustrates cross-sectional views along A-A' and B-B' in FIG. 7a, wherein the cross-sectional view along A-A' illustrates a cross section through a shared transistor of a pixel unit, and the cross-sectional view along B-B' illustrates a cross section through a shared capacitor of the pixel unit.

The cross-sectional view along A-A' schematically illustrates a cross-sectional view of a shared transistor $T_{shared}$. As shown, a shielding layer is formed in a first conductive layer M1, an active layer is formed in a semiconductor layer S, a first terminal Q1 and a second terminal Q2 are formed in a second conductive layer M2, and a gate G3 of a shared transistor is formed in a third conductive layer M3. Further, a first insulating layer I1 is provided between the first conductive layer M1 and the semiconductor layer S. A second insulating layer I2 is provided between the second conductive layer M2 and the third conductive layer M3. A third insulating layer I3 is provided on the third conductive layer M3.

Specifically, the shielding layer is formed in the first conductive layer M1, and orthographic projections of the gate G3, the first terminal Q1, and the second terminal Q2 of the shared transistor on the base fall within an orthographic projection range of the active layer of the shared transistor on the base, and orthographic projections of the gate G3, the first terminal Q1, the second terminal Q2, and the active layer of the shared transistor on the base fall within an orthographic projection range of the shielding layer on the base to shield light, thereby preventing leakage current due to backlight irradiation.

A structure of various signal lines and the shared capacitor shown in the cross-sectional view along B-B' is the same as that shown in the cross-sectional view along B-B' in FIG. 2b, and will not be described again.

Further, a structure of the switch transistor in FIG. 7a is the same as that of the switch transistor in FIG. 2a, and will not be described here.

Therefore, the array substrate implemented using the HADS technology has a stack structure including the following layers from bottom to top: a first conductive layer M1, a first insulating layer I1, a semiconductor layer S, a second conductive layer M2, a first transparent conductive layer L1, a second insulating layer I2, a third conductive layer M3, a third insulating layer I3, and a second transparent conductive layer L2. The first scanning line, the common electrode line, the first terminal of the first capacitor, the bottom gate G1 of the switch transistor, and the shielding layer are formed in the first conductive layer M1. The active layer is formed in the semiconductor layer S. The data line, the first terminal P1 and the second terminal P2 of the switch transistor, the first terminal Q1 and the second terminal Q2 of the shared transistor, the second terminal of the first capacitor, and the first terminal of the second capacitor are formed in the second conductive layer M2. The pixel electrode is formed in the first transparent conductive layer L1. The second scanning line, the floating line, the second terminal of the second capacitor, the top gate G2 of the switch transistor, and the gate G3 of the shared transistor are formed in the third conductive layer M3. The common electrode is formed in the second transparent conductive layer L2.

Figure 8A:
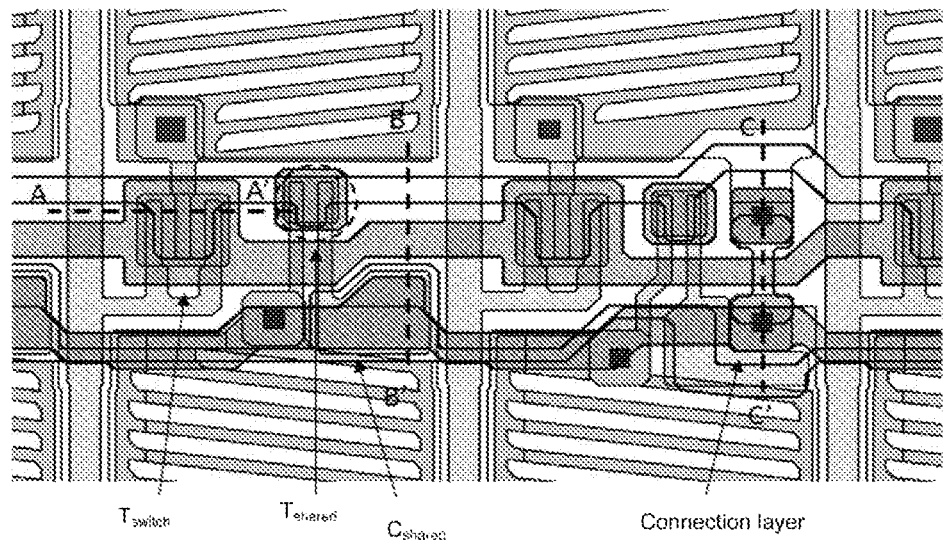
FIG. 8a is a top view of a portion of an array substrate implemented using the ADS technology according to an embodiment of the present disclosure.

FIG. 8a illustrates a top view of an array substrate implemented using the ADS technology according to an embodiment of the present disclosure. As shown, a layout of the array substrate is substantially the same as that of the array substrate shown in FIG. 3a, and only corresponding connection lines are adjusted.

Figure 8B:
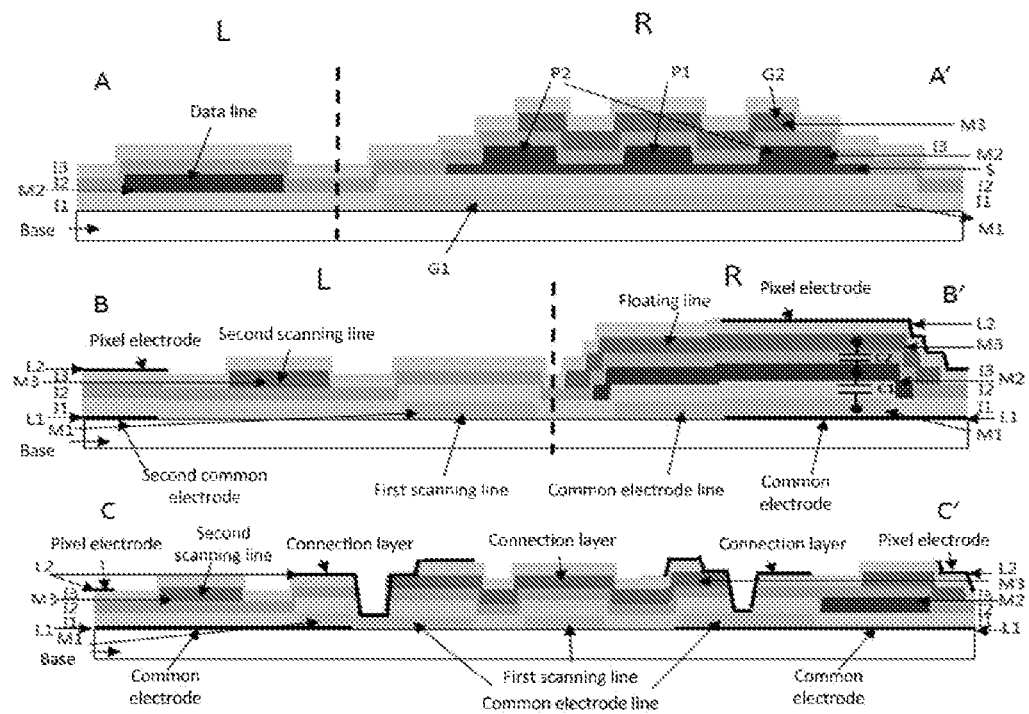

FIG. 8b illustrates cross-sectional views along A-A', B-B', and C-C' in FIG. 8a. The cross-sectional view along A-A' is a cross section through a switch transistor of a pixel unit, the cross-sectional view along B-B' is a cross section through a signal line and a shared capacitor of the pixel unit, and the cross-sectional view along C-C' is a cross section through a connection layer of the pixel unit.

Specifically, the cross-sectional view along A-A', the cross-sectional view along B-B', and the cross-sectional view along C-C' in FIG. 8b are the same as the cross-sectional view along A-A', the cross-sectional view along B-B', and the cross-sectional view along C-C' in FIG. 3b, and will not be described here.

Further, a structure of the shared transistor is similar to that of the shared transistor in FIG. 7a, and will not be described here.

Therefore, the array substrate implemented using the ADS technology has a stack structure including the following layers from bottom to top: a first transparent conductive layer L1, a first conductive layer M1, a first insulating layer I1, a semiconductor layer S, a second conductive layer M2, and a second insulating layer I2, a third conductive layer M3, a third insulating layer I3, and a second transparent conductive layer L2. The plurality of common electrodes are formed in the first transparent conductive layer L1. The first scanning line, the common electrode line, the first terminal of the first capacitor, the bottom gate G1 of the switch transistor, and the shielding layer are formed in the first conductive layer M1. The active layer is formed in the semiconductor layer S. The data line, the first terminal P1 and the second terminal P2 of the switch transistor, the first terminal Q1 and the second terminal Q2 of the shared transistor, the second terminal of the first capacitor and the first terminal of the second capacitor are formed in the second conductive layer M2. The second scanning line, the floating line, the second terminal of the second capacitor, the top gate G2 of the switch transistor, the gate G3 of the shared transistor, and the connection layer are formed in the third conductive layer M3. The pixel electrode is formed in the second transparent conductive layer L2.

Figure 9:
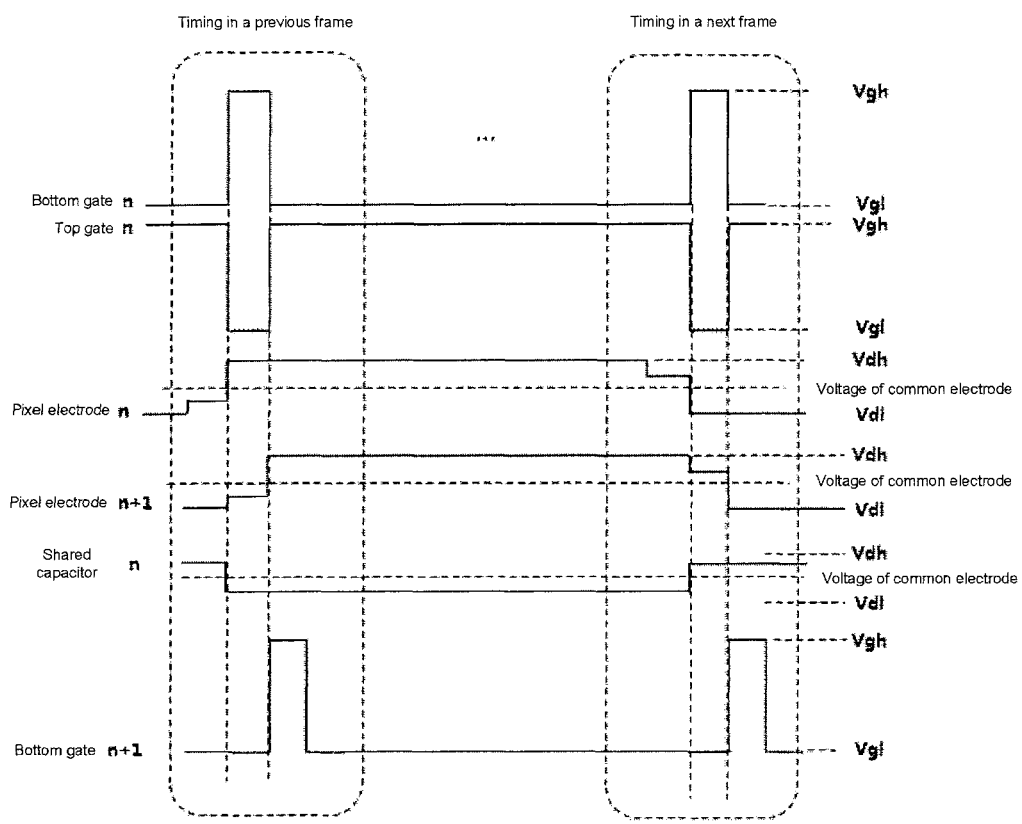
FIG. 9 is a timing diagram of various signals for driving an array substrate according to an embodiment of the present disclosure.

FIG. 9 illustrates a timing diagram of various signals for driving an array substrate according to an embodiment of the present disclosure. When an $N^{th}$ row of pixel units is turned on, charges of shared capacitors of the $N^{th}$ row of pixel units and charges of pixel electrodes of an $(N+1)^{th}$ row of pixel units are neutralized. After the neutralization, remaining charges are charged to the shared capacitors at a certain ratio as backup charges for a next sharing action. Regardless of row inversion, column inversion, or dot inversion, a pixel electrode has opposite polarities in a previous frame and in a next frame, and charges may be shared from the previous frame to the next frame through the shared capacitor.

Specifically, at the beginning of a first frame, both the shared capacitor and the pixel electrode have no charge, and there is no sharing effect produced in the first frame. In a second frame, the shared capacitor has no charge, the pixel electrode has polar charges, and a sharing effect of 50% is produced in the second frame. After the sharing action occurs, a signal with an opposite polarity is written into the pixel electrode. In a third frame, the shared capacitor and the pixel electrode have charges with opposite polarities, and the sharing effect is 100%. From an $n^{th}$ frame after the third frame to an $(n+1)^{th}$ frame, a normal charge sharing action may be completed.

Figure 10:
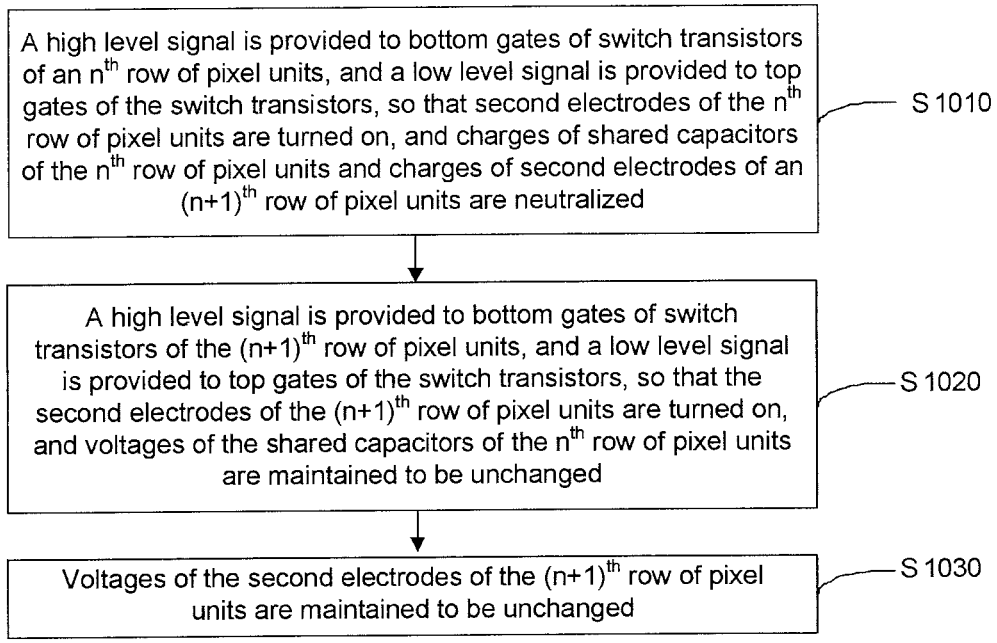
FIG. 10 is a flowchart of a method for driving an array substrate according to an embodiment of the present disclosure.

Based on the above signal timing, FIG. 10 illustrates a method for driving an array substrate according to an embodiment of the present disclosure. In the method, in a first period of time, a high level signal is provided to bottom gates of switch transistors of an $n^{th}$ row of pixel units, and a low level signal is provided to top gates of the switch transistors, so that second electrodes of the $n^{th}$ row of pixel units are turned on, and charges of shared capacitors of the $n^{th}$ row of pixel units and charges of second electrodes of an $(n+1)^{th}$ row of pixel units are neutralized. In a second period of time, a high level signal is provided to bottom gates of switch transistors of the $(n+1)^{th}$ row of pixel units, and a low level signal is provided to top gates of the switch transistors, so that the second electrodes of the $(n+1)^{th}$ row of pixel units are turned on, and voltages of the shared capacitors of the $n^{th}$ row of pixel units are maintained to be unchanged. In a third period of time, voltages of the second electrodes of the $(n+1)^{th}$ row of pixel units are maintained to be unchanged.

Therefore, the method for driving an array substrate according to the embodiment of the present disclosure can reduce the power consumption of the array substrate, enhance the charging rate, and improve the poor display phenomenon such as splash screen, afterimage etc.

In an embodiment of the present disclosure, there is further provided a method for manufacturing an array substrate, for example, the array substrate 100 and the array substrate 200 implemented using the HADS technology and the ADS technology respectively, as described above.

Figure 11:
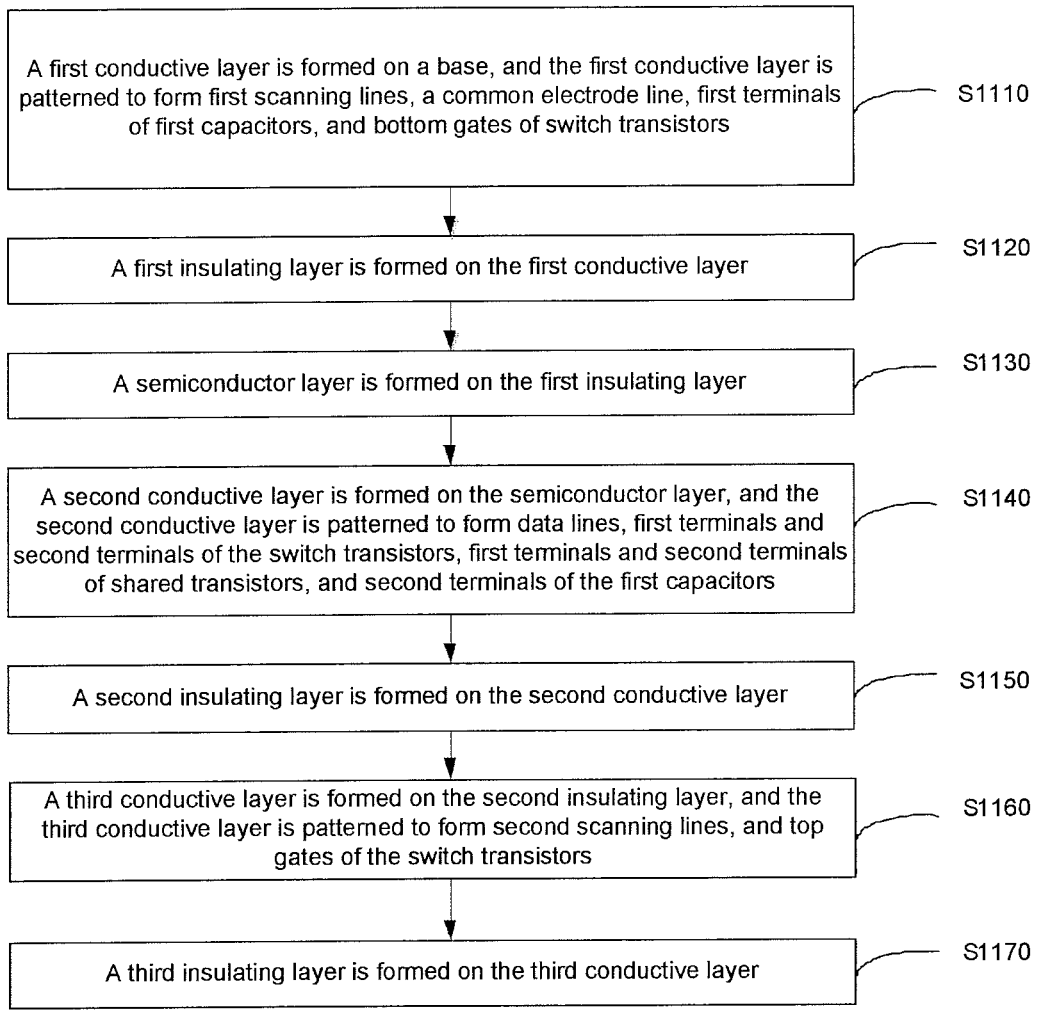
FIG. 11 is a flowchart of a method for manufacturing an array substrate according to an embodiment of the present disclosure.

FIG. 11 illustrates a flowchart of a method for manufacturing an array substrate according to an embodiment of the present disclosure. As shown in FIG. 11, in step S1110, a first conductive layer is formed on a base, and the first conductive layer is patterned to form first scanning lines, a common electrode line, first terminals of first capacitors, and bottom gates of switch transistors. In step S1120, a first insulating layer is formed on the first conductive layer. In step S1130, a semiconductor layer is formed on the first insulating layer. In step S1140, a second conductive layer is formed on the semiconductor layer, and the second conductive layer is patterned to form data lines, first terminals and second terminals of the switch transistors, first terminals and second terminals of shared transistors, and second terminals of the first capacitors. In step S1150, a second insulating layer is formed on the second conductive layer. In step S1160, a third conductive layer is formed on the second insulating layer, and the third conductive layer is patterned to form second scanning lines, and top gates of the switch transistors. In step S1170, a third insulating layer is formed on the third conductive layer.

Further, the first conductive layer or the third conductive layer is patterned to form gates of the shared transistors.

In an embodiment of the present disclosure, further, the second conductive layer may be patterned to form first terminals of second capacitors, and the third conductive layer may be patterned to form a floating line and second terminals of the second capacitors.

Further, the semiconductor layer is patterned to form an active layer of the shared transistors. When the first conductive layer is patterned to form the gates of the shared transistors, orthographic projections of the first terminal and the second terminal of the shared transistor on the base fall within an orthographic projection range of the active layer of the shared transistor on the base, and orthographic projections of the first terminal, the second terminal and the active layer of the shared transistor on the base falls within an orthographic projection range of the gate of the shared transistor on the base. Alternatively, when the third conductive layer is patterned to form the gates of the shared transistors, the method further comprises: patterning the first conductive layer to form a shielding layer. Orthographic projections of the first terminal, the second terminal and the gate of the shared transistor on the base fall within an orthographic projection range of the active layer of the shared transistor on the base, and orthographic projections of the first terminal, the second terminal, the gate, and the active layer of the shared transistor on the base fall within an orthographic projection range of the shielding layer on the base.

In an embodiment of the present disclosure, the semiconductor layer may further be patterned to form an active layer of the switch transistors. Orthographic projections of the first terminal and the second terminal of the switch transistor on the base are at least partially overlapped with an orthographic projection of the top gate of the switch transistor on the base. The orthographic projection of the top gate of the switch transistor on the base falls within an orthographic projection range of the active layer on the base. Orthographic projections of the active layer, and the first terminal, the second terminal, and the top gate of the switch transistor on the base fall within an orthographic projection range of the bottom gate of the switch transistor on the base.

Figure 12:
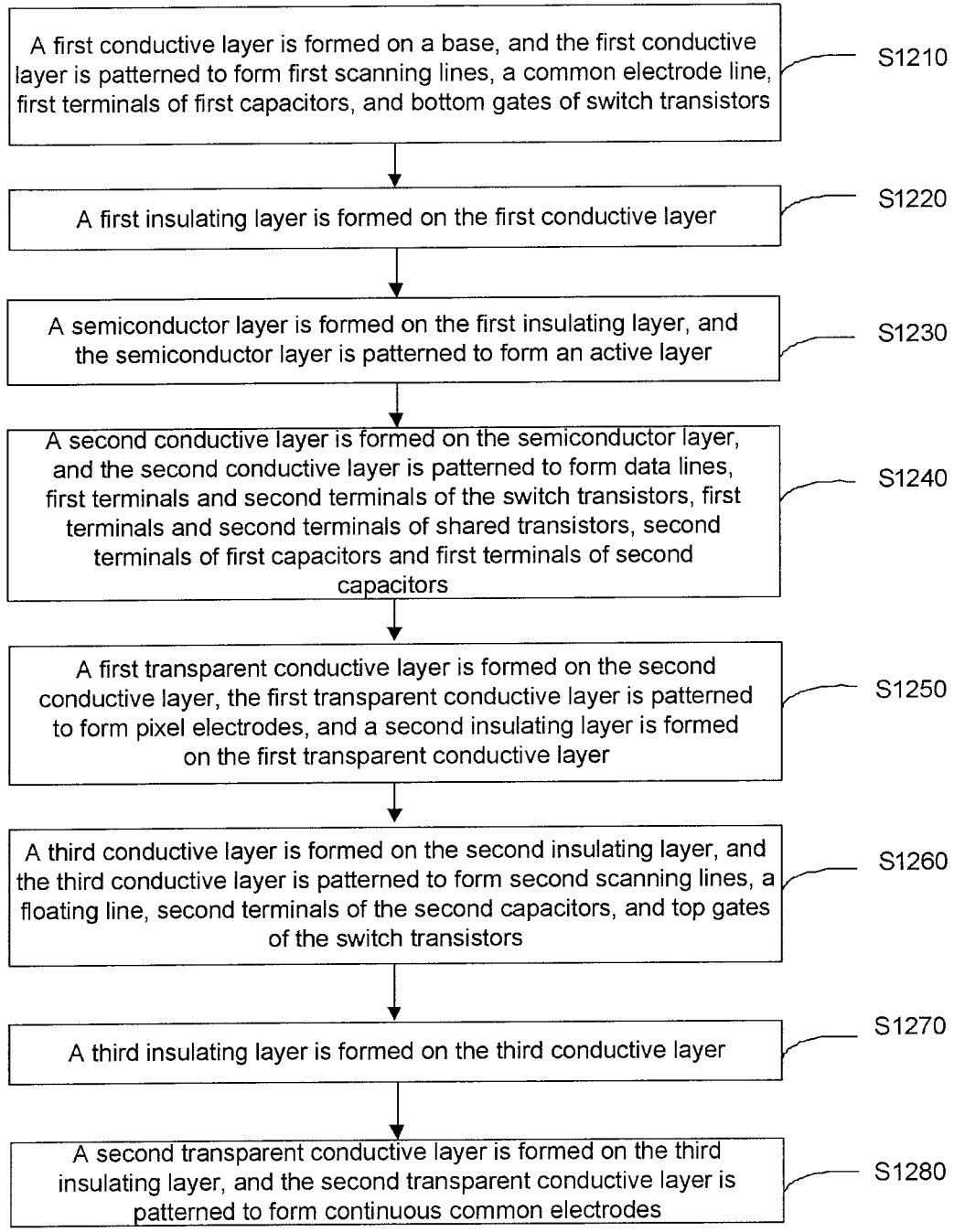
FIG. 12 is a flowchart of a method for manufacturing an array substrate using the HADS technology according to an embodiment of the present disclosure.

FIG. 12 illustrates a flowchart of a method for manufacturing an array substrate using the HADS technology, for example, the array substrates shown in FIGS. 2a and 7a, according to an embodiment of the present disclosure. As shown in FIG. 12, in step S1210, a first conductive layer is formed on a base, and the first conductive layer is patterned to form first scanning lines, a common electrode line, first terminals of first capacitors, and bottom gates of switch transistors. In step S1220, a first insulating layer is formed on the first conductive layer. In step S1230, a semiconductor layer is formed on the first insulating layer, and the semiconductor layer is patterned to form an active layer. In step S1240, a second conductive layer is formed on the semiconductor layer, and the second conductive layer is patterned to form data lines, first terminals and second terminals of the switch transistors, first terminals and second terminals of shared transistors, second terminals of first capacitors and first terminals of second capacitors. In step S1250, a first transparent conductive layer is formed on the second conductive layer, the first transparent conductive layer is patterned to form pixel electrodes, and a second insulating layer is formed on the first transparent conductive layer. In step S1260, a third conductive layer is formed on the second insulating layer, and the third conductive layer is patterned to form second scanning lines, a floating line, second terminals of the second capacitors, and top gates of the switch transistors. In step S1270, a third insulating layer is formed on the third conductive layer. In step S1280, a second transparent conductive layer is formed on the third insulating layer, and the second transparent conductive layer is patterned to form continuous common electrodes.

For the array substrate 100 shown in FIG. 2a, in step S1210, the first conductive layer may further be patterned to form gates of the shared transistors.

For the array substrate 200 shown in FIG. 7a, in step S1260, the third conductive layer may further be patterned to form gates of the shared transistors. In an embodiment, the first conductive layer may further be patterned to form a shielding layer.

In an embodiment of the present disclosure, the first insulating layer, the second insulating layer, and the third insulating layer may be formed using the same patterning process, and the semiconductor layer and the second conductive layer may be formed using the same patterning process. Thus, a total of 6 mask patterning processes are required.

Further, the shared transistors and the shared capacitors may be formed in an orthographic projection range of a non-display area on a short side of the second electrodes, thereby realizing a small aperture loss.

Figure 13:
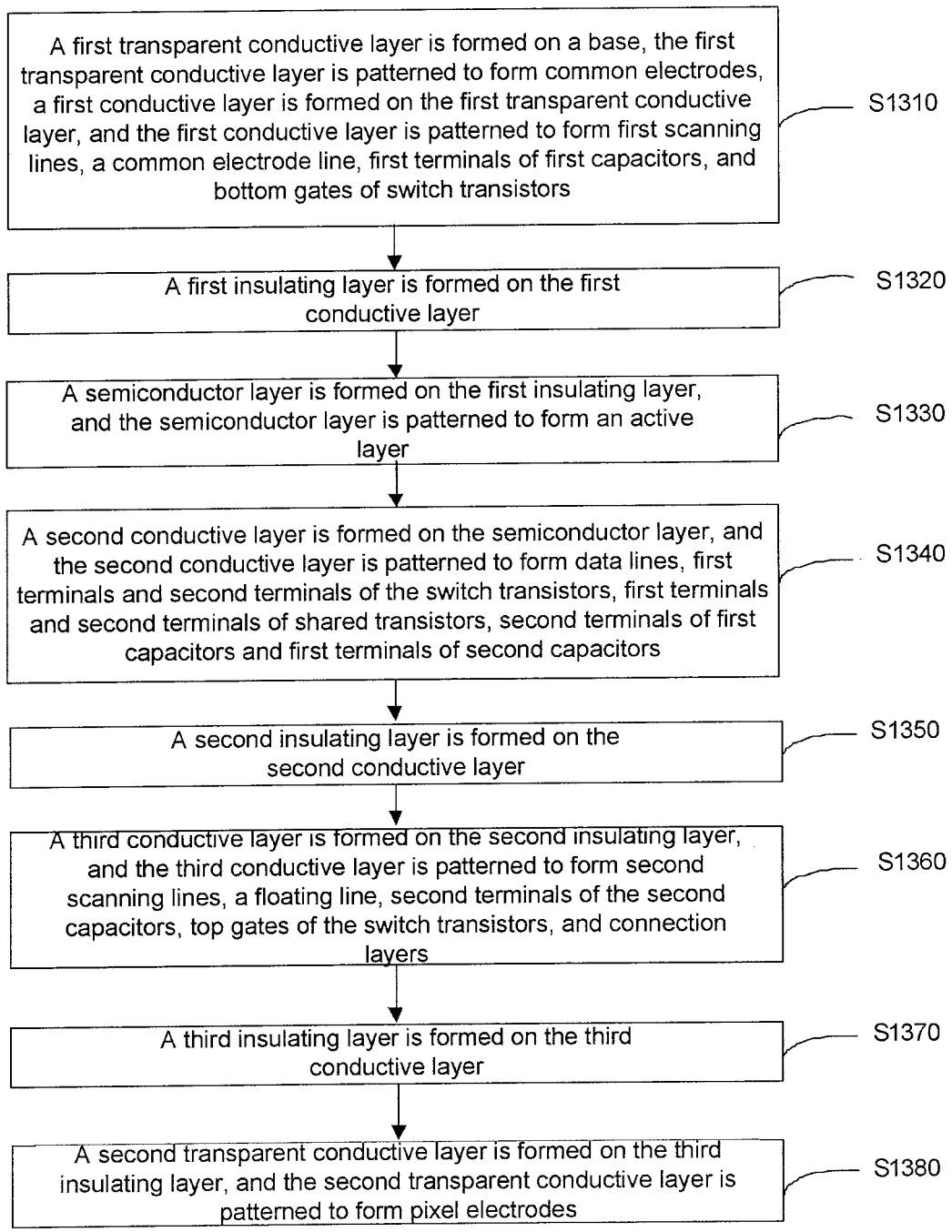
FIG. 13 is a flowchart of a method for manufacturing an array substrate using the ADS technology according to an embodiment of the present disclosure.

FIG. 13 illustrates a flowchart of a method for manufacturing an array substrate using the ADS technology, for example, the array substrates shown in FIGS. 3a and 8a, according to an embodiment of the present disclosure. As shown in FIG. 13, in step S1310, a first transparent conductive layer is formed on a base, the first transparent conductive layer is patterned to form a plurality of common electrodes independent of each other, a first conductive layer is formed on the first transparent conductive layer, and the first conductive layer is patterned to form first scanning lines, a common electrode line, first terminals of first capacitors, and bottom gates of switch transistors. In step S1320, a first insulating layer is formed on the first conductive layer. In step S1330, a semiconductor layer is formed on the first insulating layer, and the semiconductor layer is patterned to form an active layer. In step S1340, a second conductive layer is formed on the semiconductor layer, and the second conductive layer is patterned to form data lines, first terminals and second terminals of the switch transistors, first terminals and second terminals of shared transistors, second terminals of first capacitors and first terminals of second capacitors. In step S1350, a second insulating layer is formed on the second conductive layer. In step S1360, a third conductive layer is formed on the second insulating layer, and the third conductive layer is patterned to form second scanning lines, a floating line, second terminals of the second capacitors, top gates of the switch transistors, and connection layers. In step S1370, a third insulating layer is formed on the third conductive layer. In step S1380, a second transparent conductive layer is formed on the third insulating layer, and the second transparent conductive layer is patterned to form pixel electrodes.

In an embodiment of the present disclosure, for the array substrate 100 shown in FIG. 3*a*, in step S1310, the first conductive layer may further be patterned to form gates of the shared transistors.

In an embodiment of the present disclosure, for the array substrate 200 shown in FIG. 8*a*, in step S1360, the third conductive layer may further be patterned to form gates of the shared transistors. In an embodiment, the first conductive layer may further be patterned to form a shielding layer.

In an embodiment of the present disclosure, the first insulating layer, the second insulating layer, and the third insulating layer may be formed using the same patterning process, the semiconductor layer and the second conductive layer may be formed using the same patterning process, and the first transparent conductive layer and the first conductive layer may be formed using the same patterning process. Thus, a total of 5 mask patterning processes are required.

In addition, in an embodiment of the present disclosure, the third conductive layer may further be patterned to form connection layers, through which the plurality of common electrodes are coupled.

According to an embodiment of the present disclosure, there is further provided a display substrate comprising a color film substrate and the array substrate according to the embodiment of the present disclosure.

According to an embodiment of the present disclosure, there is further provided a display panel comprising the array substrate according to the embodiment of the present disclosure.

According to an embodiment of the present disclosure, there is further provided a display apparatus comprising the display panel according to the embodiment of the present disclosure. The display apparatus is, for example, a display screen, a mobile phone, a tablet computer, a wearable device, etc.

As can be seen from the above description, in the array substrate according to the embodiment of the present disclosure, dual-gate transistors are used, which can increase the charging rate, and shared capacitors and shared transistors are provided, which can realize charge sharing before charging a pixel unit, thereby reducing power consumption, enhancing the driving stability of the array substrate, and improving a poor display phenomenon such as splash screen, afterimage etc.

Several embodiments of the present disclosure have been described in detail above, but the protection scope of the present disclosure is not limited thereto. It will be apparent to those of ordinary skill in the art that various modifications, substitutions and changes can be made to the embodiments of the present disclosure without departing from the spirit and scope of the present disclosure. The protection scope of the present disclosure is defined by the appended claims.

We claim:

1. An array substrate, comprising:
   a base,
   a plurality of first scanning lines,
   a plurality of second scanning lines,
   a plurality of data lines,
   a common electrode line, and
   a plurality of pixel units,
   wherein each of the pixel units comprises:
   a first electrode;
   a second electrode;
   a switch transistor having a first terminal coupled to the second electrode, a second terminal coupled to one of the plurality of data lines, a bottom gate coupled to one of the plurality of first scanning lines, and a top gate coupled to one of the plurality of second scanning lines, and configured to transfer a data signal of the data line to the second electrode under the control of a first scanning signal of the first scanning line and a second scanning signal of the second scanning line;
   a shared transistor having a first terminal coupled to a second electrode of an immediately next row of pixel units, and a gate coupled to the bottom gate or the top gate of the switch transistor; and
   a shared capacitor comprising a first capacitor coupled between the common electrode line and a second terminal of the shared transistor.

2. The array substrate according to claim 1, wherein the shared capacitor further comprises a second capacitor coupled between the second terminal of the shared transistor and a floating line,
   wherein the floating line is provided in the same layer as that of the top gate of the switch transistor.

3. The array substrate according to claim 1, wherein first electrodes of the plurality of pixel units are electrodes which are continuously distributed in the entire plane.

4. The array substrate according to claim 1, wherein first electrodes of the plurality of pixel units are separated from each other,
   wherein the array substrate further comprises a connection layer, wherein the connection layer is provided in the same layer as that of the top gate of the switch transistor, and is configured to couple the first electrodes of the plurality of pixel units.

5. The array substrate according to claim 1, wherein in a case that the gate of the shared transistor is coupled to the bottom gate of the switch transistor,
   orthographic projections of the first terminal and the second terminal of the shared transistor on the base fall within an orthographic projection range of an active layer of the shared transistor on the base, and orthographic projections of the first terminal, the second terminal and the active layer of the shared transistor on the base fall within an orthographic projection range of the gate of the shared transistor on the base.

6. The array substrate according to claim 1, wherein in a case that the gate of the shared transistor is coupled to the top gate of the switch transistor,
   the array substrate further comprises a shielding layer which is provided in the same layer as that of the bottom gate of the switch transistor, wherein orthographic projections of the first terminal, the second terminal and the gate of the shared transistor on the base fall within an orthographic projection range of an active layer of the shared transistor on the base, and orthographic projections of the first terminal, the second terminal, the gate, and the active layer of the shared transistor on the base fall within an orthographic projection range of the shielding layer on the base.

7. The array substrate according to claim 1, wherein orthographic projections of the first terminal and the second terminal of the switch transistor on the base are at least partially overlapped with an orthographic projection of the top gate of the switch transistor on the base, the orthographic projection of the top gate of the switch transistor on the base falls within an orthographic projection range of an active layer of the switch transistor on the base, and orthographic projections of the first terminal, the second terminal, the top gate, and the active layer of the switch transistor on the base fall within an orthographic projection range of the bottom gate of the switch transistor on the base.

8. A method for driving the array substrate according to claim 1, comprising:
providing a high level signal to bottom gates of switch transistors of an $n^{th}$ row of pixel units, and providing a low level signal to top gates of the switch transistors, so that second electrodes of the $n^{th}$ row of pixel units are turned on, and charges of shared capacitors of the $n^{th}$ row of pixel units and charges of second electrodes of an $(n+1)^{th}$ row of pixel units are neutralized;
providing a high level signal to bottom gates of switch transistors of the $(n+1)^{th}$ row of pixel units, and providing a low level signal to top gates of the switch transistors, so that the second electrodes of the $(n+1)^{th}$ row of pixel units are turned on, and voltages of the shared capacitors of the $n^{th}$ row of pixel units are maintained to be unchanged; and
maintaining voltages of the second electrodes of the $(n+1)^{th}$ row of pixel units to be unchanged.

9. A method for manufacturing an array substrate, comprising:
forming a first conductive layer on a base, and patterning the first conductive layer to form first scanning lines, a common electrode line, first terminals of first capacitors, and bottom gates of switch transistors;
forming a first insulating layer on the first conductive layer;
forming a semiconductor layer on the first insulating layer;
forming a second conductive layer on the semiconductor layer, and patterning the second conductive layer to form data lines, first terminals and second terminals of the switch transistors, first terminals and second terminals of shared transistors, and second terminals of the first capacitors;
forming a second insulating layer on the second conductive layer;
forming a third conductive layer on the second insulating layer, and patterning the third conductive layer to form second scanning lines, and top gates of the switch transistors; and
forming a third insulating layer on the third conductive layer,
wherein the first conductive layer or the third conductive layer is patterned to form gates of the shared transistors.

10. The method according to claim 9, further comprising:
forming a first transparent conductive layer on the second conductive layer, patterning the first transparent conductive layer to form second electrodes, and forming the second insulating layer on the first transparent conductive layer; and
forming a second transparent conductive layer on the third insulating layer, and patterning the second transparent conductive layer to form first electrodes.

11. The method according to claim 9, further comprising:
forming a first transparent conductive layer on the base, patterning the first transparent conductive layer to form a plurality of first electrodes, and forming the first conductive layer on the first transparent conductive layer;

forming a second transparent conductive layer on the third insulating layer, and patterning the second transparent conductive layer to form second electrodes; and
patterning the third conductive layer to form a connection layer through which the plurality of first electrodes are coupled.

12. The method according to claim 9, further comprising:
patterning the second conductive layer to form first terminals of second capacitors; and
patterning the third conductive layer to form a floating line and second terminals of the second capacitors.

13. A display panel, comprising the array substrate according to claim 1.

14. The display panel according to claim 13, wherein the shared capacitor further comprises a second capacitor coupled between the second terminal of the shared transistor and a floating line,
wherein the floating line is provided in the same layer as that of the top gate of the switch transistor.

15. The display panel according to claim 13, wherein first electrodes of the plurality of pixel units are electrodes which are continuously distributed in the entire plane.

16. The display panel according to claim 13, wherein first electrodes of the plurality of pixel units are separated from each other,
wherein the array substrate further comprises a connection layer, wherein the connection layer is provided in the same layer as that of the top gate of the switch transistor, and is configured to couple the first electrodes of the plurality of pixel units.

17. The display panel according to claim 13, wherein in a case that the gate of the shared transistor is coupled to the bottom gate of the switch transistor,
orthographic projections of the first terminal and the second terminal of the shared transistor on the base fall within an orthographic projection range of an active layer of the shared transistor on the base, and orthographic projections of the first terminal, the second terminal and the active layer of the shared transistor on the base falls within an orthographic projection range of the gate of the shared transistor on the base.

18. The display panel according to claim 13, wherein in a case that the gate of the shared transistor is coupled to the top gate of the switch transistor,
the array substrate further comprises a shielding layer which is provided in the same layer as that of the bottom gate of the switch transistor, wherein orthographic projections of the first terminal, the second terminal and the gate of the shared transistor on the base fall within an orthographic projection range of an active layer of the shared transistor on the base, and orthographic projections of the first terminal, the second terminal, the gate, and the active layer of the shared transistor on the base fall within an orthographic projection range of the shielding layer on the base.

19. The display panel according to claim 13, wherein orthographic projections of the first terminal and the second terminal of the switch transistor on the base are at least partially overlapped with an orthographic projection of the top gate of the switch transistor on the base, the orthographic projection of the top gate of the switch transistor on the base falls within an orthographic projection range of an active layer of the switch transistor on the base, and orthographic projections of the first terminal, the second terminal, the top gate, and the active layer of the switch transistor on the base fall within an orthographic projection range of the bottom gate of the switch transistor on the base.

20. A display apparatus, comprising the display panel according to claim 13.

\* \* \* \* \*